United States Patent [19]

Wright

[11] 3,896,486

[45] July 22, 1975

[54] POWER TRANSISTOR HAVING GOOD THERMAL FATIGUE CAPABILITIES

[75] Inventor: Jerome Edward Wright, Neshanic Station, N.J.

[73] Assignee: RCA Corporation, New York, N.Y.

[22] Filed: June 3, 1971

[21] Appl. No.: 149,615

Related U.S. Application Data

[63] Continuation of Ser. No. 726,741, May 6, 1968, abandoned.

[52] U.S. Cl. ........................ 357/67; 357/68; 357/69; 357/34; 357/35; 357/36

[51] Int. Cl.²...... H01L 23/48; H01L 29/46; H01L 29/62; H01L 29/64

[58] Field of Search ....... 317/234, 235, 40.1, 40.12, 317/40.13, 5.4, 41.1

[56] References Cited

UNITED STATES PATENTS

| | | | |
|---|---|---|---|
| 3,309,585 | 3/1967 | Forrest | 317/234 |
| 3,336,508 | 8/1967 | Preletz et al. | 317/235 |
| 3,381,183 | 4/1968 | Turner et al. | 317/235 |
| 3,437,887 | 4/1969 | Nowalk et al. | 317/235 |
| 3,441,814 | 4/1969 | Steinmetz | 317/234 |
| 3,453,503 | 7/1969 | Schulz et al. | 317/235 |

FOREIGN PATENTS OR APPLICATIONS

| | | | |
|---|---|---|---|
| 935,710 | 9/1963 | United Kingdom | 317/234 |

OTHER PUBLICATIONS

General Electric's SCR Manual, 4th Edition, 1967, pages 7 to 9.

*Primary Examiner*—Andrew J. James
*Attorney, Agent, or Firm*—G. H. Bruestle; H. Christoffersen; R. P. Williams

[57] ABSTRACT

A bipolar power transistor in which the emitter region is composed of a plurality of segments radiating from a central area. Each segment has a tree-like configuration and comprises a trunk with pairs of lateral branches extending from opposite sides thereof. Each trunk terminates at the outer periphery with a relatively large area, high current bonding pad. The device includes a base region having segments of complementary shape, each including a trunk and lateral branches interdigitated with the emitter branches. The device also has an emitter contact electrode comprising a metal plate suspended above the transistor surface, the plate making a high-current connection to each emitter segment only at each bonding pad. The plate has a central aperture through which a base contact electrode extends.

5 Claims, 3 Drawing Figures

INVENTOR.
Jerome E. Wright
BY L. L. Allen
ATTORNEY

INVENTOR.
Jerome E. Wright
BY H. L. Allen

ATTORNEY

POWER TRANSISTOR HAVING GOOD THERMAL FATIGUE CAPABILITIES

This application is a continuation of an earlier application Ser. No. 726,741, filed May 6, 1968 and now abandoned.

BACKGROUND OF THE INVENTION

A number of problems have been encountered in designing bipolar power transistors. One of these problems is that emitter-base current tends to concentrate at certain points along the emitter-base junction, causing local overheating and eventual breakdown of the crystal structure, and subsequent failure of the device.

Another problem found in power transistors is that of heat dissipation. The amount of heat which must be dissipated per unit of area is considerable, and if it is not properly dissipated it can also lead to device failure.

Power transistors have previously been made with a number of different emitter region and base region configurations. Since it has been found that nearly all the emission from an emitter region takes place around its periphery, emitters have been designed to achieve maximum periphery with lowest possible surface area. One type of design for achieving this large perimeter dimension is the comb-shaped emitter having fingers interdigitated with a complementary comb structure for the base region, and is commonly referred to as an "interdigitated" structure. One interdigitated variation utilizes a pin wheel, or star-shaped, emitter having tapered fingers or spokes interdigitated with complementary shaped fingers of the base region. Another emitter structure consists of a "snowflake" pattern, in which the emitter comprises a series of trunks extending to the edge of the device, with lateral branches extending from the trunks; an example of this structure is disclosed in British Pat. No. 935,710, to Turner. In this structure, emitter contact is made simultaneously to the entire emitter pattern. Still another structure utilizes an emitter consisting of a multiplicity of separated sites all connected together in parallel to function as a single emitter, and is known as the "overlay" design.

The comb-shaped structure had the disadvantage of having the active area of the emitter concentrated in a relatively small area of the device surface, which increases the heat dissipation problem since a relatively large amount of heat is generated in a relatively small area. The star-shaped emitter had the disadvantage that it can use only a single contact at the center and, because of heavy current concentration, heavy metallizing of the central portion was necessary. The "snowflake" pattern solves many of these problems; however, the thermal fatigue capabilities of devices using this pattern coupled with a contact made to the entire pattern, is less than is desired.

The multiple emitter site type solved the problems with respect to device operation, especially at higher voltages, where it greatly decreased the danger of junction breakdown, but it required relatively expensive evaporated metal deposition to interconnect all of the emitter sites.

SUMMARY OF THE INVENTION

The invention comprises a power transistor in which the emitter is composed of a plurality of segments symmetrically arranged about a central device area which comprises a part of the base region of the device. Each emitter segment, which radiates outwardly from the central area, is composed of a tree-like diffused portion having a central trunk from opposite sides of which project pairs of branches. Each trunk terminates at the periphery with a high current, large area bonding pad. The base region has branches of complementary shape, interdigitated with the emitter branches. The device further includes an emitter contact electrode which comprises a metal plate with a central aperture, suspended above the wafer surface and making a high-current connection to each emitter segment only at each bonding pad. A base contact electrode extends through the aperture of the emitter contact electrode and is connected to the base region in the central area of the device.

THE DRAWING

FIG. 1 is a top plan view of the emitter and base regions of the device in FIG. 2, prior to complete assembly, FIG. 2 is a top plan view of a completely assembled device in accordance with the present invention, and FIG. 3 is a section view taken along the line 3—3 of FIG. 2.

DETAILED DESCRIPTION

Figure 1:
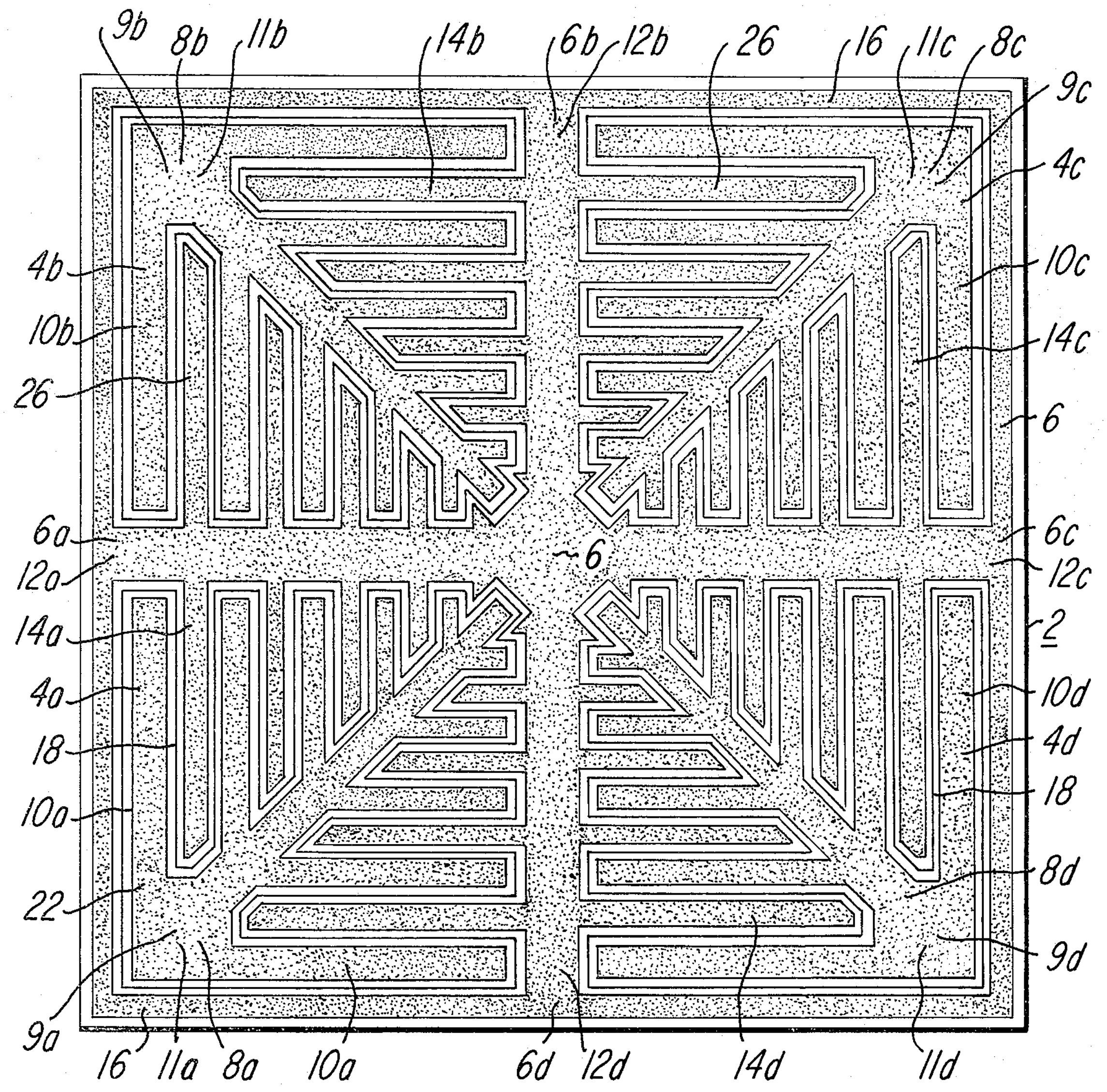
Figure 2:
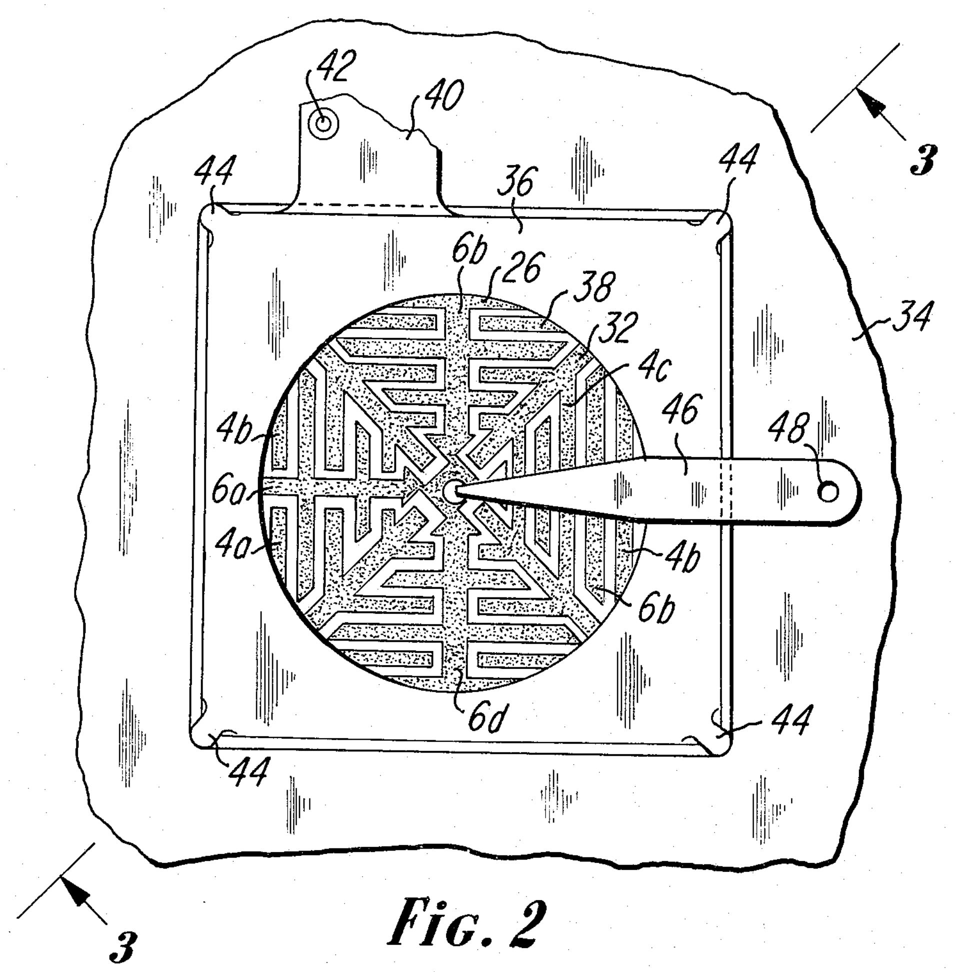

As illustrated in FIG. 1, a preferred embodiment of a device in accordance with the present invention includes a semiconductor wafer 2 having an emitter region which is composed of four separate segments 4*a*, 4*b*, 4*c* and 4*d* radiating outwardly from the central area of the device. Each of these emitter segments is in a different quarter of the semiconductor pellet. Each emitter segment has a tree-like configuration and is composed of a central trunk portion 8(*a*, *b*, *c* and *d*) with pairs of lateral branches 10(*a*, *b*, *c* and *d*) extending from opposite sides thereof. The branches are of regularly increasing length in a direction looking outwardly from the center of the device. Each trunk portion 8(*a*, *b*, *c* and *d*) terminates at the periphery of the device at a high-current, large area bonding pad 9(*a*, *b*, *c* and *d*). Preferably, the emitter region is of mesa type and projects above the surface of the surrounding base region.

The remainder of the top portion of the semiconductor pellet 2 is occupied by a base region 6. The base region 6 includes a central portion 6′ and four segments 6(*a*, *b*, *c* and *d*) connected to the central portion 6′ and radiating therefrom. Each of the base region segments comprises a trunk portion 12(*a*, *b*, *c* and *d*) and pairs of laterally-extending branches 14(*a*, *b*, *c* and *d*) which are interdigitated with the emitter region branches 10(*a*, *b*, *c* and *d*). The base region trunk portions 12(*a*, *b*, *c* and *d*) are all connected with a rectangular frame portion 16 of the base region extending around the periphery of the pellet 2.

The emitter and base regions, as described above, have been designed to distribute emitter-base current evenly over the entire surface area of the pellet.

Figure 3:
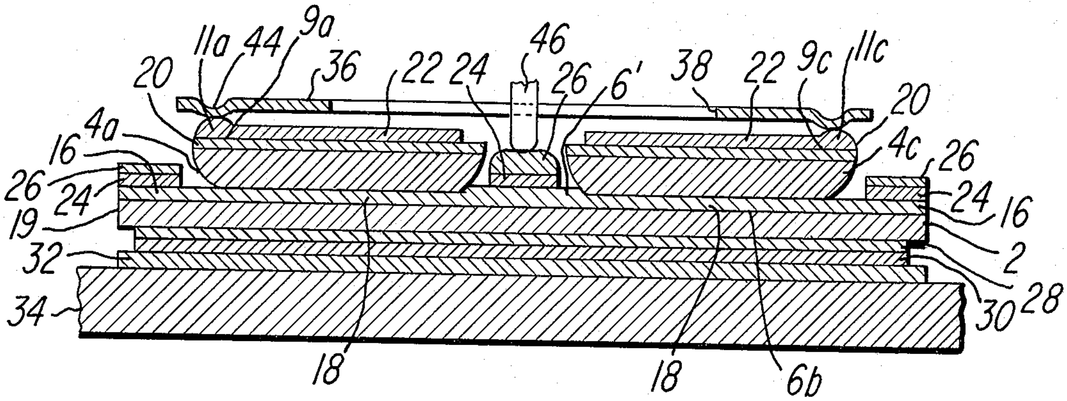

The emitter and base regions are separated by four p-n junctions 18. The device also includes a collector region 19 (FIG. 3) of conductivity type opposite that of the base region.

In order to make good, high-current low resistance contact to all parts of the top surface of the emitter and base regions they are provided with metal layers. The metal layer on the emitter region segments comprises an adherence-promoting sub-layer of nickel 20 (FIG.

3) and a top layer portion of solder 22. Similarly, the base region has a sub-layer of nickel 24 and a top layer of solder 26. An additional raised portion 11(*a–d*) of solder is provided over each bonding pad 9(*a–d*) to facilitate a high-current contact only at each bonding pad. Preferably, each bonding pad 9(*a–d*) is coterminous with the outermost branches of each trunk 8(*a–d*).

The nickel layer is deposited as follows. First, a thin layer of nickel is electrolessly deposited from a solution over the entire upper surface of the pellet. This is then sintered at 800°C. in a hydrogen atmosphere for 15 minutes. A second layer of nickel is then deposited electrolessly over the first layer. This is done by first defining the areas where the nickel is to be deposited, using conventional photoresist and masking methods and removal of photoresist where the metal is to be deposited. The second layer of nickel is not deposited over the exposed line of p-n junction 18. Nickel is deposited on the surfaces not covered by photoresist. The deposit area includes a layer 28 on most of the bottom surface of the pellet 2.

With the photoresist remaining in place, the entire unit is dipped in molten solder. The solder adheres to the nickel layers 20 and 24 on the emitter and base regions respectively, forming solder layers 22 and 26. A solder layer 30 also deposits on the bottom nickel layer 28.

The pellet is then etched to remove the photoresist and to etch the exposed p-n junction 18.

The pellet 2 is then mounted on a molybdenum plate 32 by melting the solder layer 30. The molybdenum plate was previously brazed to a copper header 34. The collector of the transistor is thus grounded to the header.

A particular feature of the present invention is the emitter contact electrode. This electrode comprises a rectangular-shaped metal plate 36 having a central aperture 38. The plate also has an arm extending from one edge and the arm is soldered to a pin 42 which passes through the header but is insulated therefrom by means of a ceramic eyelet (not shown). The plate 36 is spaced above the pellet surface except at its corners. The corners of the plate 36 have dimpled projections 44 which are soldered only to the bonding pads 9(*a–d*). The emitter contact electrode is capable of carrying heavy currents and is a good heat radiator. Further, because the emitter contact electrode makes contact only at the periphery of each trunk, the outer branches and portions of each trunk carry the largest amount of emitter current. That is, the inner branches of each emitter segment 4*a–d* closest to the central base region portion 6' carries much less current than the outer branches.

Thus, generated heat is concentrated at the periphery of the wafer, where it is more easily removed. As a result, the thermal fatigue and current-handling characteristics of the device are greatly improved over devices employing a contact made to the entire emitter pattern. Using the contact electrode of the present invention, transistors have been constructed which easily handle 70 amps of current.

The transistor also includes a base contact electrode 46 which comprises a tapered piece of phosphor bronze having one end soldered to a pit 48 that passes through header 34 but is insulated therefrom by means of a ceramic eyelet (not shown). The other end of contact electrode 46 is bent down through the aperture 38 in the emitter contact electrode 36 and makes contact with the base region in central area 6'.

I claim:

1. A transistor comprising:

a. a wafer of semiconducting material including emitter, base and collector regions;

b. said emitter region being of one conductivity type and being disposed adjacent a surface of said wafer, said emitter region being composed of a plurality of separate portions each of which comprises a trunk with pairs of lateral branches extending from a central area of said surface and said branches being of progressively increasing length toward the periphery of said surface;

c. a bonding pad at the periphery of each said trunk;

d. a base region of opposite conductivity type also adjacent said wafer surface, said base portion including said central surface area and having branches interdigitated with said emitter region branches;

e. an emitter contact electrode comprising a metal plate suspended above said wafer surface, said plate being connected only to each of said bonding pads, said plate having a central aperture, and;

f. a base contact electrode extending through said aperture connected to said central area base region portion.

2. A transistor according to claim 1, wherein each said bonding pad is coterminous with the outermost branches of each said trunk.

3. A transistor according to claim 2, in which said emitter is composed of four separate segments each of which is located in a different quarter of said wafer surface.

4. A transistor according to claim 3, in which said emitter region is a mesa type.

5. A transistor according to claim 4, in which said emitter and base regions are metallized with solder.

* * * * *